United States Patent
Yamakoshi et al.

(10) Patent No.: US 7,605,481 B2
(45) Date of Patent: Oct. 20, 2009

(54) NICKEL ALLOY SPUTTERING TARGET AND NICKEL ALLOY THIN FILM

(75) Inventors: Yasuhiro Yamakoshi, Ibaraki (JP); Ryo Suzuki, Ibaraki (JP)

(73) Assignee: Nippon Mining & Metals Co., Ltd., Tokyo (JP)

( * ) Notice: Subject to any disclaimer, the term of this patent is extended or adjusted under 35 U.S.C. 154(b) by 282 days.

(21) Appl. No.: 10/575,888

(22) PCT Filed: Oct. 14, 2004

(86) PCT No.: PCT/JP2004/015115

§ 371 (c)(1),
(2), (4) Date: Apr. 13, 2006

(87) PCT Pub. No.: WO2005/041290

PCT Pub. Date: May 6, 2005

(65) Prior Publication Data

US 2007/0074790 A1    Apr. 5, 2007

(30) Foreign Application Priority Data

Oct. 24, 2003 (JP) ............................. 2003-364048

(51) Int. Cl.
*H01L 23/48*    (2006.01)
(52) U.S. Cl. ................. 257/779; 257/E23.015
(58) Field of Classification Search ............... 257/780, 257/737, 738, 772, 779, E23.015, E23.02, 257/E23.023, 616; 148/426–428
See application file for complete search history.

(56) References Cited

U.S. PATENT DOCUMENTS 4,094,761 A    6/1978  Wilson 4,159,909 A    7/1979  Wilson (Continued)

FOREIGN PATENT DOCUMENTS

JP    09-074097 A    3/1997

(Continued)

OTHER PUBLICATIONS

ESP@CENET Database, One page English Abstract of JP 56-110230, Sep. 1, 1981.

(Continued)

*Primary Examiner*—Davienne Monbleau
*Assistant Examiner*—Hoa B Trinh
(74) *Attorney, Agent, or Firm*—Howson & Howson LLP

(57) ABSTRACT

The present invention relates to a nickel alloy sputtering target comprising 1 to 30 at % of Cu; 2 to 25 at % of at least one element selected from among V, Cr, Al, Si, Ti and Mo; remnant Ni and unavoidable impurities so as to inhibit the Sn diffusion between a solder bump and a substrate layer or a pad. Provided are a nickel alloy sputtering target and a nickel alloy thin film for forming a barrier layer having excellent wettability with the Pb-free Sn solder or Sn—Pb solder bump, and capable of inhibiting the diffusion of Sn being a soldering component and effectively preventing the reaction with the substrate layer upon forming a Pb-free Sn solder or Sn—Pb solder bump on a substrate such as a semiconductor wafer or electronic circuit or a substrate layer or pad of the wiring or electrode formed thereon.

20 Claims, 3 Drawing Sheets

Ni-Cu-Si AUGER PROFILE

U.S. PATENT DOCUMENTS

| | | |
|---|---|---|
| 4,900,638 A | 2/1990 | Emmerich |
| 5,264,050 A | 11/1993 | Nakashima et al. |
| 5,334,267 A | 8/1994 | Taniguchi et al. |
| 5,964,966 A | 10/1999 | Goyal et al. |
| 6,033,536 A | 3/2000 | Ichihara et al. |
| 6,086,725 A | 7/2000 | Abburi et al. |
| 6,190,516 B1 | 2/2001 | Xiong et al. |
| 6,342,114 B1 | 1/2002 | Lam et al. |
| 6,485,542 B2 | 11/2002 | Shindo et al. |
| 2003/0193094 A1* | 10/2003 | Takahashi et al. ........... 257/780 |
| 2004/0256035 A1 | 12/2004 | Yamakoshi et al. |
| 2006/0037680 A1 | 2/2006 | Yamakoshi |
| 2006/0088436 A1 | 4/2006 | Okabe |
| 2006/0137782 A1 | 6/2006 | Yamakoshi et al. |
| 2006/0292028 A1 | 12/2006 | Shindo et al. |
| 2007/0051624 A1 | 3/2007 | Okabe et al. |
| 2007/0098590 A1 | 5/2007 | Shindo |
| 2007/0209547 A1 | 9/2007 | Irumata et al. |

FOREIGN PATENT DOCUMENTS

| | | |
|---|---|---|
| JP | 11-117061 A | 4/1999 |

OTHER PUBLICATIONS

ESP@CENET Database, One page English Abstract of JP 2000-169922, Jun. 20, 2000.

ESP@CENET Database, One page English Abstract of JP 2000-169957, Jun. 20, 2000.

ESP@CENET Database, One page English Abstract of JP 2000-169923, Jun. 20, 2000.

ESP@CENET Database, One page English Abstract of JP 2001-011612, Jan. 16, 2001.

* cited by examiner

Ni-Cu-Si AUGER PROFILE

Ni-Cu AUGER PROFILE

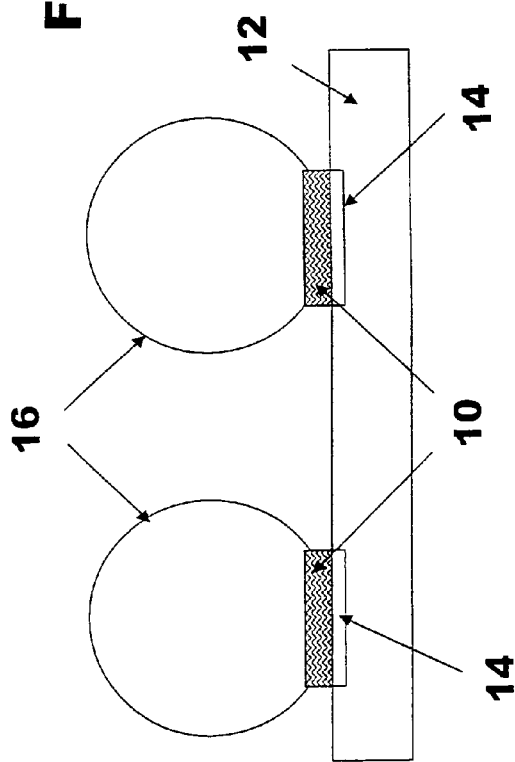
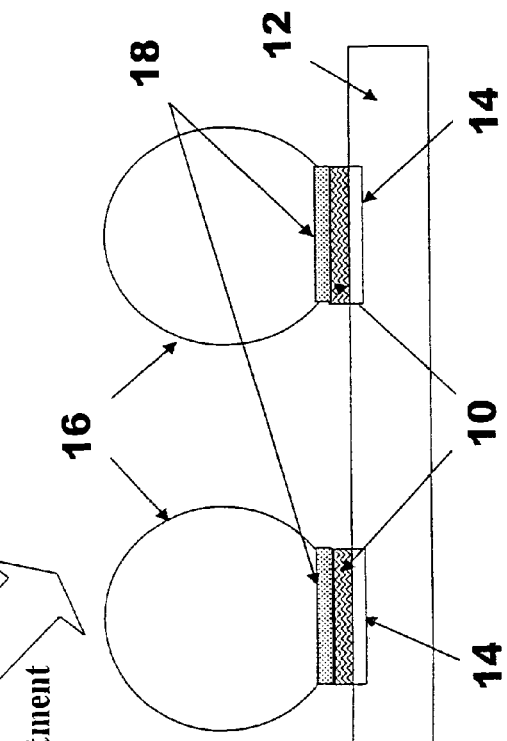

NICKEL ALLOY SPUTTERING TARGET AND NICKEL ALLOY THIN FILM

BACKGROUND OF THE INVENTION

The present invention relates to a nickel alloy sputtering target for forming a barrier layer and a nickel alloy thin film capable of inhibiting the diffusion of Sn as the component of a Sn solder or Sn—Pb solder between a substrate such as a semiconductor wafer or electronic circuit or a substrate layer or pad of the wiring or electrode formed thereon, and a Pb-free Sn solder or Sn—Pb solder bump formed thereon.

Generally, an aluminum or copper electrode or pad is formed on a semiconductor wafer or electronic circuit, or on the substrate thereof, and a conductive solder bump, Au bump, nickel bump or the like is additionally formed thereon. Among the above, a solder bump is the current mainstream material since it is easy to install and easy to repair.

Nevertheless, since an electrode substrate layer or pad formed from copper or the like easily reacts with a Pb-free Sn solder or Sn—Pb solder, after the solder bump is formed, there is a problem in that Sn diffusion will occur due to the heat arising in the manufacturing process or usage environment, a reaction will occur with the electrode substrate layer or pad formed from copper or the like as the substrate, and the characteristics will deteriorate due to the separation of the electrode layer or pad, or diffusion of the solder in the elements.

Due to the foregoing reasons, a proposal has been made for forming an intermediate barrier layer, via the sputtering method, capable of preventing the reaction between a substrate or an electrode substrate layer or pad formed from copper, and a Pb-free Sn solder or Sn—Pb solder bump.

A prerequisite of this intermediate barrier layer is that it has excellent adhesiveness with a substrate or a copper electrode substrate layer, and the wettability of the Pb-free Sn solder or Sn—Pb solder bump is excellent.

Nickel has been selected as this kind of material. Nevertheless, since nickel is a ferromagnetic material, it has inferior sputtering efficiency, and the nickel target must be made extremely thin in order to improve the sputtering efficiency. Thus, there is a problem in that the manufacture of this target is complicated, the target life is short, the target must be exchanged frequently, and, as a result, the manufacturing cost is increased.

Thus, a Ni—Cu alloy series film has been proposed as a material for reducing the magnetism of the Ni target and improving the sputtering efficiency (e.g., refer to Patent Document 1 and Patent Document 2). Nevertheless, this Ni—Cu alloy film does not necessarily have sufficient Sn barrier properties, and there is a problem in that it would react with the substrate film and increase electrical resistance.

As described above, since there is no sputtering target material capable of forming an effective barrier layer to become the intermediate layer with excellent solder wettability, when using a Pb-free Sn solder or Sn—Pb solder bump, problems often arise in that a reaction with the substrate or substrate copper layer would occur.

Meanwhile, in order to improve the adhesion with a ceramic substrate, a proposal has been made to use a nickel alloy target in which Mo, V and W are added to Ni (e.g., refer to Patent Document 3, Patent Document 4 and Patent Document 5). Further, a proposal has been made for using nickel alloy with Ti added thereto in order to improve the Sn barrier characteristics and to improve the etching characteristics (refer to Patent Document 6).

Nevertheless, although these are able to form a Ni alloy target and Ni alloy thin film, these are insufficient as a sputtering target capable of forming an effective barrier layer to become the intermediate layer with excellent solder wettability.

[Patent Document 1] Japanese Patent Laid-Open Publication No. S54-24231
[Patent Document 2] Japanese Patent Laid-Open Publication No. S56-110230
[Patent Document 3] Japanese Patent Laid-Open Publication No. 2000-169922
[Patent Document 4] Japanese Patent Laid-Open Publication No. 2000-169957
[Patent Document 5] Japanese Patent Laid-Open Publication No. 2000-169923
[Patent Document 6] Japanese Patent Laid-Open Publication No. 2001-11612

SUMMARY OF THE INVENTION

Thus, an object of the present invention is to provide a nickel alloy sputtering target and a nickel alloy thin film for forming a barrier layer having excellent wettability with the Pb-free Sn solder or Sn—Pb solder bump, and capable of inhibiting the diffusion of Sn being a soldering component and effectively preventing the reaction with the substrate layer upon forming a Pb-free Sn solder or Sn—Pb solder bump on a substrate such as a semiconductor wafer or electronic circuit or a substrate layer or pad of the wiring or electrode formed thereon; in particular, upon forming a Pb-free Sn solder or Sn—Pb solder bump on a substrate layer or pad formed from copper or copper alloy.

The present invention provides:

1) A nickel alloy sputtering target comprising 1 to 30 at % of Cu; 2 to 25 at % of at least one element selected from among V, Cr, Al, Si, Ti and Mo; remnant Ni and unavoidable impurities so as to inhibit the Sn diffusion between a solder bump and a substrate layer or a pad;
2) The nickel alloy sputtering target according to paragraph 1) above, wherein the nickel alloy is formed by adding at least one element selected from among V, Cr, Al, Si, Ti and Mo to Ni—Cu solid solution;
3) The nickel alloy sputtering target according to paragraph 1) or paragraph 2) above, wherein the solder bump is a Pb-free Sn solder or a Sn solder;
4) A nickel alloy thin film formed between a solder bump and a substrate layer or a pad, and comprising 1 to 30 at % of Cu; 2 to 25 at % of at least one element selected from among V, Cr, Al, Si, Ti and Mo; remnant Ni and unavoidable impurities;
5) The nickel alloy thin film formed between a solder bump and a substrate layer or a pad according to paragraph 4) above, wherein the nickel alloy is formed by adding at least one element selected from among V, Cr, Al, Si, Ti and Mo to Ni—Cu solid solution;
6) The nickel alloy thin film formed between a solder bump and a substrate layer or a pad according to paragraph 4) or paragraph 5) above, wherein the solder bump is a Pb-free Sn solder or a Sn solder;
7) The nickel alloy thin film according to any one of paragraphs 4) to 6) above, further comprising a Cu—Sn intermetallic compound layer between a solder bump and a substrate layer or a pad;
8) The nickel alloy thin film according to paragraph 7) above, further comprising a 0.01 to 5 μm Cu—Sn intermetallic compound layer between a solder bump and a substrate layer or a pad.

The nickel alloy sputtering target for forming a barrier layer of the present invention and the nickel alloy thin film thereby yield superior effects of effectively inhibiting the diffusion of Sn as the component of a Sn solder or Sn—Pb solder between a substrate such as a semiconductor wafer or electronic circuit or a substrate layer or pad of the wiring or electrode formed thereon, and a Pb-free Sn solder or Sn—Pb solder bump formed thereon.

The present invention also yields a significant effect in possessing favorable soldering wettability, and facilitating magnetron sputtering due to its paramagnetism or feeble magnetism.

BRIEF DESCRIPTION OF THE DRAWINGS

FIG. 3 is a schematic view of an assembly of a substrate, baffler layer and solder bump according to the present invention; and FIG. 4 is a schematic view of the assembly of FIG. 3 after heat treatment.

DETAILED DESCRIPTION OF THE INVENTION

Figure 1:
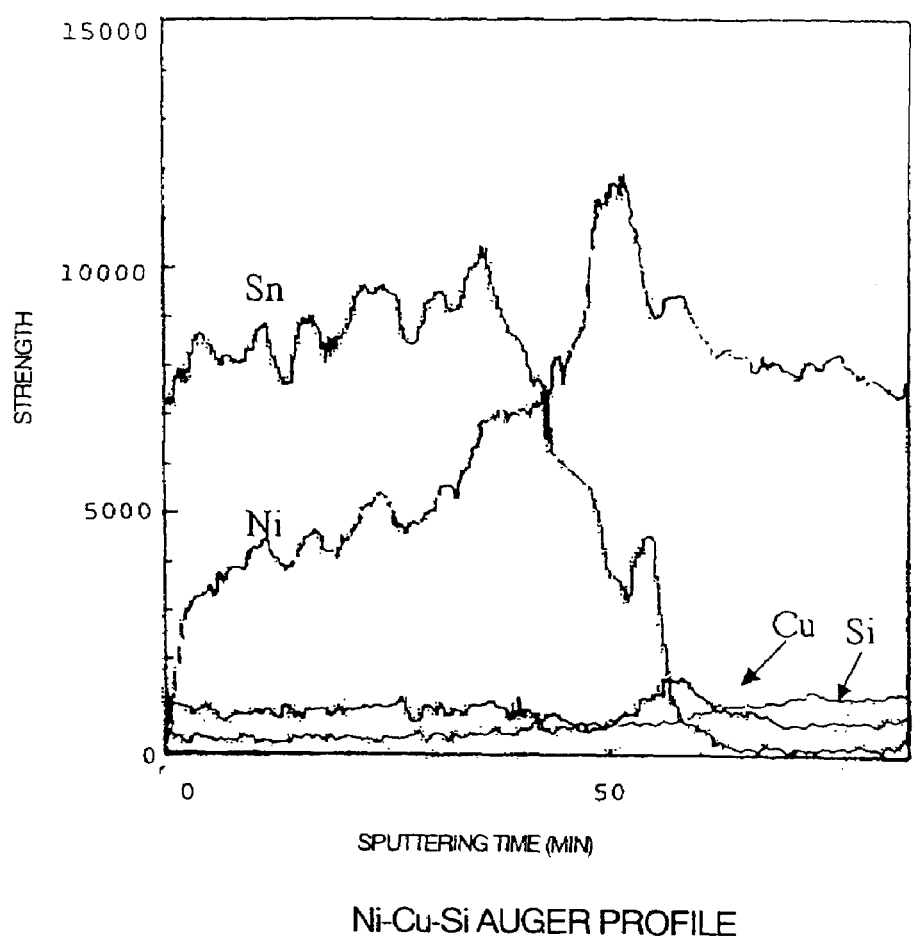
FIG. 1 shows the results upon measuring the strength in the depth direction of Sn with an Auger Electron Spectrometer from the Sn film side with respect to the deposition sample of Example 6.

A barrier layer 10 having excellent wettability with a Sn—Pb solder bump is formed with a Ni—Cu alloy series (hereinafter referred to as the "Ni—Cu alloy series") sputtering target of the present invention comprising 1 to 30 at % of Cu; 2 to 25 at % of at least one element selected from among V, Cr, Al, Si, Ti and Mo; remnant Ni and unavoidable impurities, and this is formed on a substrate 12 such as a semiconductor wafer or electronic circuit or a substrate layer or pad 14 of the wiring or electrode formed thereon; in particular, on a substrate layer or pad 14 formed from copper or copper alloy. For instance, see FIG. 3.

By adding 2 to 25 at % of at least one element selected from among V, Cr, Al, Si, Ti and Mo, the Curie point of Ni as a ferromagnetic material can be decreased linearly to realize paramagnetism.

Originally, Ni is a material with excellent solder wettability. Further, it also functions as a diffusion barrier of soldering to a certain degree. Nevertheless, since it is a ferromagnetic material, there is a problem in that it is extremely difficult to perform magnetron sputtering.

As a result of adding the foregoing V, Cr, Al, Si, Ti or Mo, magnetron sputtering is enabled, and a significant effect is yielded in that the productivity is improved. Although an addition of Cu itself also functions to reduce the magnetism of Ni, this is insufficient since large amounts of Cu must be added.

Incidentally, this barrier layer is not limited to a single layer, and may also be a composite layer with another material.

A Pb-free Sn solder bump or Sn—Pb solder bump 16 is further formed on the barrier layer 10 formed with the Ni—Cu alloy series sputtering target of the present invention, and the diffusion of Sn as the component of this solder bump 16 can be effectively inhibited with the baffler layer 10 of the present invention, and the reaction with the substrate 12 or copper layer as the substrate layer 14 can be effectively prevented.

The addition of 1 to 30 at % of Cu to Ni has a Sn diffusion prevention function. Since Cu is exceptionally reactive to Sn in comparison to Ni, an intermetallic compound ($Cu_6Sn_5$, $Cu_3Sn$) layer 18 of Cu—Sn is formed between the solder 16 via heat treatment. This layer 18 exhibits an effect as a diffusion baffler. See FIG. 4.

The inhibition effect of Sn diffusion by this Ni—Cu alloy barrier layer is considered to be realized since the Sn movement and diffusion from the Pb-free Sn solder bump or Sn—Pb solder bump are prevented since Sn is already saturated in the Ni—Cu film as the intermediate barrier.

If this Cu—Sn intermetallic compound layer is too thick cracks will easily occur and cause the dropout or separation of the solder. Further, if this is too thin, it will lose its function as the barrier layer, and it is desirable that the thickness is generally 0.01 to 5 μm.

Moreover, this Ni—Cu alloy barrier layer is characterized in that it possesses extremely excellent wettability with the Pb-free Sn solder bump or Sn—Pb solder bump as described above.

As the component of the nickel alloy sputtering target for forming the Ni—Cu alloy barrier layer, 1 to 30 at % of Cu is required.

If this amount is less than 1 at %, the Cu—Sn intermetallic compound ($Cu_6Sn_5$, $Cu_3Sn$) layer cannot be sufficiently formed, and the effect as a diffusion barrier cannot be exhibited. Further, if Cu exceeds 30 at %, the Cu—Sn intermetallic compound layer will be formed thicker and cracks will occur easily. Thus, it is necessary to keep Cu at 30 at % or lower.

Meanwhile, 2 to 25 at % of at least one element selected from among V, Cr, Al, Si, Ti and Mo must be added in the Ni—Cu alloy series of the present invention. If the additive amount is less than 2 at %, the Curie point cannot be decreased sufficiently, the magnetism of Ni as a ferromagnetic material will be maintained, and the magnetron sputtering efficiency for forming the thin film layer will be inferior. Further, if the additive amount exceeds 25 at %, the effective functions of Ni such as solder wettability and etching property will deteriorate.

As the target, since a single phase of metallographic structure is preferable, it is necessary to inhibit the additive amount of the respective added elements and the solid solution area of Ni. If the structure becomes a two-phase structure or greater, there is a problem in that particles will arise during sputtering.

The nickel alloy target for forming a barrier layer of the present invention may be formed with the ingot method; that is, subjecting the Ni—Cu alloy series to melting, casting, forging, rolling and other processes to form the target. With an ingot target, Cu in the alloy exists as a solid solution.

Further, the nickel alloy target for forming a barrier layer of the present invention may also be formed with powder metallurgy. Here, it would be effective to form a sintered nickel alloy target with nickel alloy powder prepared using a pulverization process such as the atomization method.

When using this kind of nickel alloy atomized powder, a sintered body having superior uniformity can be obtained. A target having better quality than a sintered target prepared with ordinary nickel powder, copper powder and powder of added elements can be obtained.

In the sintering process, for instance, a target is prepared with HP or HIP. This kind of nickel alloy sputtering target comprises a structure in which the Cu is a solid solution due to the composition and manufacture process.

With respect to the crystalline structure, it is desirable that the average grain size is 100 μm or less. Thereby, a uniform barrier film can be formed.

In order to prevent the contamination of the semiconductor or other electronic components, it is desirable that the purity of nickel, copper and added elements to become the target raw material is 3N (99.9%) or higher, preferably 5N or higher.

EXAMPLES

Examples of the present invention are now explained. These Examples are merely illustrative, and the present invention shall in no way be limited thereby. In other words, the present invention shall only be limited by the scope of the present invention, and shall include the various modificatons other than the Examples of this invention.

Example 1 to Example 42

A Ni block having a purity of 5N (99.999 wt %) and Cu having a purity of 4N (99.99 wt %) and V shot were used as the raw material. 1600 g of Ni was melted with a vacuum high frequency induction furnace having a water-cooled copper crucible in a vacuum atmosphere. Cu and the added elements shown in Table 1 were added in small portions, and melted to ultimately become the alloy composition shown in Table 1.

This was tapped at a molten metal temperature of 1500° C. to prepare a cast ingot. This ingot was subject to hot forging and hot rolling at less than 800° C. to 1130° C. This was further subject to machining to prepare a target of ϕ80mm× thickness of 10 mm. The list of compositions of Cu, added elements (V, Cr, Al, Si, Ti, Mo) and remnant Ni of the nickel alloy target is shown in Table 1.

Comparative Example 1

A Ni block having a purity of 5N and Cu shot having a purity of 4N were used as the raw material. 1600 g of Ni was melted with a vacuum highfrequency induction furnace having a water-cooled copper crucible in a vacuum atmosphere. Cu was added in small portions, and melted to ultimately become Ni-50 at % Cu.

This was tapped at a molten metal temperature of 1400° C. to prepare a cast ingot. As with Example 1, this ingot was subject to plastic working through hot forging and hot rolling to prepare a target.

Comparative Example 2

A Ni block having a purity of 5N and Cu shot having a purity of 4N were used as the raw material. 1600 g of Ni was melted with a vacuum high-frequency induction furnace having a water-cooled copper crucible in a vacuum atmosphere. Cu was added in small portions, and meted to ultimately become Ni-2 at % Cu.

This was tapped at a molten metal temperature of 1500° C. to prepare a cast ingot. As with Example 1, this ingot was subject to plastic working through hot forging and hot rolling to prepare a target.

Comparative Example 3

A Ni block having a purity of 5N and V shot having a purity of 4N were used as the raw material. 1600 g of Ni was melted with a vacuum highfrequency induction furnace having a water-cooled copper crucible in a vacuum atmosphere. V was added in small portions, and melted to ultimately become Ni-5 at % V.

This was tapped at a molten metal temperature of 1500° C. to prepare a cast ingot. As with Example 1, this ingot was subject to plastic working through hot forging and hot rolling to prepare a target.

Comparative Example 4

A Ni block having a purity of 5N and Cu shot having a purity of 4N were used as the raw material. 1600 g of Ni was melted with a vacuum high-frequency induction furnace having a water-cooled copper crucible in a vacuum atmosphere. Cu and V were added in small portions, and melted to ultimately become Ni-40 at % Cu-5 at % V.

This was tapped at a molten metal temperature of 1400° C. to prepare a cast ingot. As with Example 1, this ingot was subject to plastic working through hot forging and hot rolling to prepare a target.

Comparative Example 5

A Ni block having a purity of 5N and Cu shot having a purity of 4N were used as the raw material. 1600 g of Ni was melted with a vacuum highfrequency induction furnace having a water-cooled copper crucible in a vacuum atmosphere. Al and V were added in small portions, and melted to ultimately become Ni-5 at % Al-5 at % V.

This was tapped at a molten metal temperature of 1400° C. to prepare a cast ingot. As with Example 1, this ingot was subject to plastic working through hot forging and hot rolling to prepare a target.

The list of compositions of the nickel alloy target of Comparative Examples 1 to 5 is similarly shown in Table 1 in comparison to Examples 1 to 42.

TABLE 1

| | | Nickel Alloy (at %) | |
| --- | --- | --- | --- |
| | | Cu | Added Elements (V, Cr, Al, Si, Ti, Mo) | Ni |
| Example | 1 | 10% | 5% V | Remnant |
| Example | 2 | 10% | 3% Al, 3% Cr | Remnant |
| Example | 3 | 10% | 3% Si, 3% Ti, 2%Mo | Remnant |
| Example | 4 | 20% | 6% Cr | Remnant |
| Example | 5 | 7% | 6% Al | Remnant |
| Example | 6 | 25% | 3% Si | Remnant |
| Example | 7 | 5% | 20%V | Remnant |
| Example | 8 | 10% | 10% V | Remnant |
| Example | 9 | 30% | 5% V | Remnant |
| Example | 10 | 30% | 10% V | Remnant |
| Example | 11 | 2% | 2% Cr | Remnant |
| Example | 12 | 2% | 25% Cr | Remnant |
| Example | 13 | 15% | 25% Cr | Remnant |
| Example | 14 | 25% | 2% Cr | Remnant |
| Example | 15 | 25% | 25% Cr | Remnant |
| Example | 16 | 7% | 23% Al | Remnant |
| Example | 17 | 20% | 12% Al | Remnant |
| Example | 18 | 20% | 23% Al | Remnant |
| Example | 19 | 30% | 12% Al | Remnant |
| Example | 20 | 30% | 23% Al | Remnant |
| Example | 21 | 5% | 5% Si | Remnant |
| Example | 22 | 5% | 20% Si | Remnant |
| Example | 23 | 10% | 5% Si | Remnant |
| Example | 24 | 10% | 20% Si | Remnant |
| Example | 25 | 30% | 20% Si | Remnant |
| Example | 26 | 2% | 12% Ti | Remnant |
| Example | 27 | 2% | 24% Ti | Remnant |
| Example | 28 | 15% | 12% Ti | Remnant |
| Example | 29 | 15% | 24% Ti | Remnant |

TABLE 1-continued

Nickel Alloy (at %)

|  | Cu | Added Elements (V, Cr, Al, Si, Ti, Mo) | Ni |
|---|---|---|---|
| Example 30 | 25% | 12% Ti | Remnant |
| Example 31 | 25% | 24% Ti | Remnant |
| Example 32 | 5% | 5% Mo | Remnant |
| Example 33 | 5% | 20% Mo | Remnant |
| Example 34 | 10% | 5% Mo | Remnant |
| Example 35 | 10% | 20% Mo | Remnant |
| Example 36 | 30% | 5% Mo | Remnant |
| Example 37 | 30% | 20% Mo | Remnant |
| Example 38 | 10% | 5% V, 5% Si | Remnant |
| Example 39 | 10% | 3% Mo, 7% Ti | Remnant |
| Example 40 | 15% | 6% Si, 3% Mo, 2% Cr | Remnant |
| Example 41 | 27% | 8% Mo, 2% Si | Remnant |
| Example 42 | 27% | 4% Al, 6% Ti, 2% Mo | Remnant |
| Comparative Example 1 | 50% |  | Remnant |
| Comparative Example 2 | 2% |  | Remnant |
| Comparative Example 3 |  | 5% V | Remnant |
| Comparative Example 4 | 40% | 5% V | Remnant |
| Comparative Example 5 |  | 5% V, 5% Al | Remnant |

(Wettability Evaluation Test with Sn—Pb (Sn:Pb = 4:6) Solder)

After forming a Ti film of 1000 Å on a Si substrate with magnetron sputtering, the targets of Examples 1 to 42 and Comparative Examples 1 to 5 were used to form a Ni alloy film of 4000 Å with magnetron sputtering.

A Sn—Pb (Sn:Pb=4:6) soldering ball having a diameter of 0.60 mm was placed on this sputtered film, heated to 240° C. in the atmosphere, and the spread in the diameter of the soldering ball was measured.

As a result, in Examples 1 to 42 of the present invention, the average diameter of the heated soldering ball was within the range of 0.76 to 1.36 mm, and it is evident that the wettability with the Sn—Pb solder is excellent.

Contrarily, with Comparative Example 3 and Comparative Example 5, the solder wettability was somewhat defective.

(Sn Diffusion Evaluation Test)

After forming a Ti film on a Si substrate with sputtering, the targets of Examples 1 to 42 and Comparative Examples 1 to 5 were used to respectively form a Ni alloy film of 5000 Å with sputtering.

Thereafter, a Sn target was used to form a Sn film of 3000 Å, and retained in a vacuum at 250° C. for 3 minutes. Then, the deposition sample was cut into a prescribed size, the strength in the depth direction of Sn was measured with the Auger Electron Spectrometer from the Sn film side, and the diffusion pattern was observed.

As a result, each of the Examples 1 to 42 was able to inhibit the diffusion of Sn to be low. Further, the magnetron sputtering characteristic was also excellent. Contrarily, Comparative Examples 1 to 5 showed significant diffusion of Sn.

Figure 2:
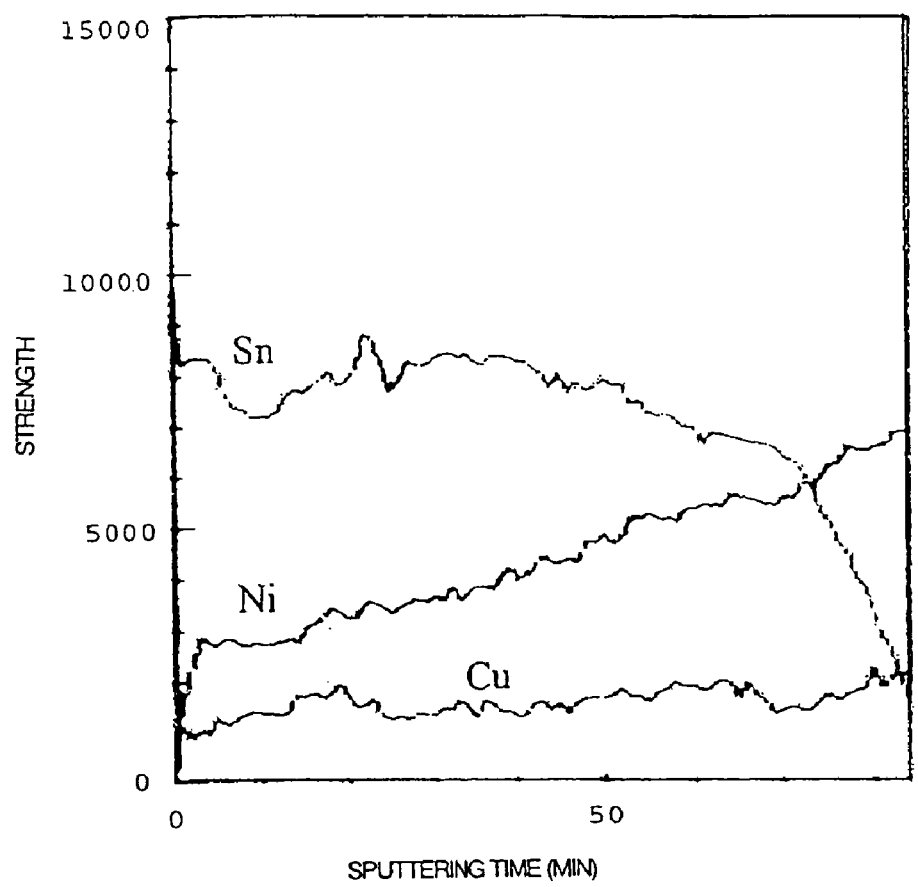
FIG. 2 shows the results upon measuring the strength in the depth direction of Sn with an Auger Electron Spectrometer from the Sn film side with respect to the deposition sample of Comparative Example 1.

As a representative example, the Auger measurement results of Example 6 and Comparative Example 1 are shown in FIG. 1 and FIG. 2. In FIG. 1 and FIG. 2, the horizontal axis represents the sputtering time, and the vertical axis represents strength. The interface of the Sn/Ni alloy film is considered to be around the sputtering time of 40 to 50 minutes.

In FIG. 1 of Example 6, with 40 to 50 minutes being the boundary, the existence of Sn is decreasing rapidly, and this signifies that the diffusion of Sn is being inhibited. Contrarily, in FIG. 2 of the Comparative Examples, large amounts of Sn were still detected even after sputtering was performed for 40 to 50 minutes, and this signifies that Sn was dispersed in such amount internally.

Further, with Comparative Example 1, although the solder wettability was favorable and the diffusion of Sn was inhibited, there was a problem in that microcracks occurred.

In Comparative Example 2, although the solder wettability was favorable, the diffusion of Sn was significant and lost its effect as a barrier layer. Moreover, there was a problem regarding the stability of plasma.

In Comparative Example 3, the solder wettability was somewhat inferior, and magnetron sputtering deteriorated significantly. Further, the diffusion of Sn was significant, and there was not effect as a barrier layer.

In Comparative Example 4, although the solder wettability and sputtering characteristic were favorable, the barrier properties were inferior and cracks occurred.

In Comparative Example 5, although there was no generation of cracks, the solder wettability was somewhat defective, the barrier properties were also inferior, and the sputtering characteristic was also somewhat inferior.

Contrarily, as described above, with the Examples of the present invention, the barrier properties were superior, and the solder wettability, crack resistance properties and sputtering characteristics all excellent, and it is evident that a superior nickel alloy target has been provided. Results of the foregoing evaluation test are shown in Table 2.

TABLE 2

|  |  | Solder Wettability | Barrier Properties | Cracks | Sputtering Characteristic |
|---|---|---|---|---|---|
| Example | 1 | Excellent | Superior | None | Excellent |
| Example | 2 | Excellent | Superior | None | Excellent |
| Example | 3 | Excellent | Superior | None | Excellent |
| Example | 4 | Excellent | Superior | None | Excellent |
| Example | 5 | Excellent | Superior | None | Excellent |
| Example | 6 | Excellent | Superior | None | Excellent |
| Example | 7 | Excellent | Superior | None | Excellent |
| Example | 8 | Excellent | Superior | None | Excellent |
| Example | 9 | Excellent | Superior | None | Excellent |
| Example | 10 | Excellent | Superior | None | Excellent |
| Example | 11 | Excellent | Superior | None | Excellent |
| Example | 12 | Excellent | Superior | None | Excellent |
| Example | 13 | Excellent | Superior | None | Excellent |
| Example | 14 | Excellent | Superior | None | Excellent |
| Example | 15 | Excellent | Superior | None | Excellent |
| Example | 16 | Excellent | Superior | None | Excellent |
| Example | 17 | Excellent | Superior | None | Excellent |
| Example | 18 | Excellent | Superior | None | Excellent |
| Example | 19 | Excellent | Superior | None | Excellent |
| Example | 20 | Excellent | Superior | None | Excellent |
| Example | 21 | Excellent | Superior | None | Excellent |
| Example | 22 | Excellent | Superior | None | Excellent |
| Example | 23 | Excellent | Superior | None | Excellent |
| Example | 24 | Excellent | Superior | None | Excellent |
| Example | 25 | Excellent | Superior | None | Excellent |
| Example | 26 | Excellent | Superior | None | Excellent |
| Example | 27 | Excellent | Superior | None | Excellent |
| Example | 28 | Excellent | Superior | None | Excellent |
| Example | 29 | Excellent | Superior | None | Excellent |
| Example | 30 | Excellent | Superior | None | Excellent |
| Example | 31 | Excellent | Superior | None | Excellent |
| Example | 32 | Excellent | Superior | None | Excellent |
| Example | 33 | Excellent | Superior | None | Excellent |
| Example | 34 | Excellent | Superior | None | Excellent |
| Example | 35 | Excellent | Superior | None | Excellent |
| Example | 36 | Excellent | Superior | None | Excellent |
| Example | 37 | Excellent | Superior | None | Excellent |
| Example | 38 | Excellent | Superior | None | Excellent |
| Example | 39 | Excellent | Superior | None | Excellent |
| Example | 40 | Excellent | Superior | None | Excellent |
| Example | 41 | Excellent | Superior | None | Excellent |
| Example | 42 | Excellent | Superior | None | Excellent |
| Comparative Example | 1 | Excellent | Inferior | Cracks | Excellent |
| Comparative Example | 2 | Excellent | Inferior | None | Defective |

TABLE 2-continued

|  |  | Solder Wetability | Barrier Properties | Cracks | Sputtering Characteristic |
|---|---|---|---|---|---|
| Comparative Example | 3 | Somewhat Defective | Inferior | None | Excellent |
| Comparative Example | 4 | Excellent | Inferior | Cracks | Excellent |
| Comparative Example | 5 | Somewhat Defective | Inferior | None | Somewhat Defective |

The present invention yields a significant effect in that it has excellent wettability with a Pb-free Sn solder or Sn—Pb solder bump, and capable of inhibiting the diffusion of Sn being a component of the Pb-free Sn solder or Sn—Pb solder and effectively preventing the reaction with the substrate layer. Further, since the nickel alloy target of the present invention has paramagnetism or feeble magnetism, the present invention also yields a significant effect in that magnetron sputtering can be performed easily.

Therefore, the nickel alloy sputtering target and nickel alloy thin film of the present invention are useful as a barrier layer of a solder bump to be formed on a substrate such as a semiconductor wafer or electronic circuit, or a substrate layer or pad such as a wiring or electrode formed on such substrate.

The invention claimed is:

1. A nickel alloy sputtering target for forming a film for preventing tin (Sn) diffusion, comprising a sputtering target body of a predetermined diameter and a predetermined thickness adapted to form a thin film via magnetron sputtering, said sputtering target body being made of a composition of 1 to 30 atomic percent of copper (Cu); 2 to 25 atomic percent of at least one element selected from a group consisting of vanadium (V), chromium (Cr), aluminum (Al), silicon (Si), and molybdenum (Mo); and remnant nickel (Ni).

2. The nickel alloy sputtering target according to claim 1, wherein the copper in said sputtering target body exists in a solid solution, and wherein the nickel alloy is formed by adding said at least one element to a Ni—Cu solid solution.

3. A nickel alloy thin film formed between a solder bump and a substrate layer or a pad, said nickel alloy thin film comprising 1 to 30 atomic percent of copper (Cu); 2 to 25 atomic percent of at least one element selected from a group consisting of vanadium (V), chromium (Cr), aluminum (Al), silicon (Si), titanium (Ti) and molybdenum (Mo); and remnant nickel (Ni).

4. The nickel alloy thin film formed between a solder bump and a substrate layer or a pad according to claim 3, wherein the copper exists in a solid solution in said thin film, and wherein the nickel alloy is formed by adding said at least one element to a Ni—Cu solid solution.

5. A nickel alloy thin film according to claim 3, wherein the solder bump is a Pb-free Sn solder or a Sn solder.

6. A nickel alloy thin film according to claim 5, further comprising an intermetallic compound layer between the solder bump and the substrate layer or pad, said intermetallic compound layer consisting of Cu and Sn.

7. A nickel alloy thin film according to claim 6, wherein said Cu—Sn intermetallic compound layer is of a thickness of 0.01 to 5 µm.

8. A nickel alloy thin film according to claim 3, further comprising an intermetallic compound layer between the solder bump and the substrate layer or pad, said intermetallic compound layer consisting of Cu and Sn.

9. A nickel alloy thin film according to claim 8, wherein said Cu—Sn intermetallic compound layer is of a thickness of 0.01 to 5 µm.

10. The nickel alloy sputtering target according to claim 1, wherein said composition of said sputtering target body includes titanium (Ti), wherein a total amount of Ti together with said at least one element is 2 to 25 atomic percent.

11. A nickel alloy sputtering target, consisting of:
a sputtering target body of a predetermined diameter and a predetermined thickness adapted to form a thin film via magnetron sputtering;
said sputtering target body being made of a composition consisting of 1 to 30 atomic percent of copper (Cu); 2 to 25 atomic percent of an additional element selected from a group consisting of vanadium (V), chromium (Cr), aluminum (Al), silicon (Si), and molybdenum (Mo); and remnant nickel (Ni);
the copper in said sputtering target body existing in a solid solution; and
said sputtering target body having a single phase metallographic structure and an average grain size of 100 µm or less.

12. A nickel alloy sputtering target according to claim 11, wherein said additional element is chromium (Cr), aluminum (Al), silicon (Si), or molybdenum (Mo).

13. A nickel alloy sputtering target according to claim 11, wherein said additional element is aluminum (Al), silicon (Si), or molybdenum (Mo).

14. A nickel alloy sputtering target according to claim 13, wherein said predetermined thickness of said sputtering target body is 10 mm.

15. A nickel alloy sputtering target according to claim 1, wherein said at least one element is chromium (Cr), aluminum (Al), silicon (Si), or molybdenum (Mo).

16. A nickel alloy sputtering target according to claim 1, wherein said at least one element is aluminum (Al), silicon (Si), or molybdenum (Mo).

17. A nickel alloy sputtering target according to claim 1, wherein said predetermined thickness of said sputtering target body is 10 mm.

18. A nickel alloy sputtering target according to claim 1, wherein said predetermined diameter of said sputtering target body is 80 mm.

19. A nickel alloy thin film according to claim 3, wherein said at least one element is chromium (Cr), aluminum (Al), silicon (Si), or molybdenum (Mo).

20. A nickel alloy thin film according to claim 3, wherein said at least one element is aluminum (Al), silicon (Si), or molybdenum (Mo).

* * * * *

UNITED STATES PATENT AND TRADEMARK OFFICE
CERTIFICATE OF CORRECTION

PATENT NO. : 7,605,481 B2
APPLICATION NO. : 10/575888
DATED : October 20, 2009
INVENTOR(S) : Yamakoshi et al.

It is certified that error appears in the above-identified patent and that said Letters Patent is hereby corrected as shown below:

Column 3, line 67 "the baffler layer" should read "the barrier layer"

Column 4, line 9 "baffler" should read "barrier"

Signed and Sealed this

Twenty-ninth Day of December, 2009

David J. Kappos
*Director of the United States Patent and Trademark Office*

UNITED STATES PATENT AND TRADEMARK OFFICE
CERTIFICATE OF CORRECTION

PATENT NO.      : 7,605,481 B2  Page 1 of 1
APPLICATION NO. : 10/575888
DATED           : October 20, 2009
INVENTOR(S)     : Yamakoshi et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 472 days.

Signed and Sealed this

Fifth Day of October, 2010

David J. Kappos
*Director of the United States Patent and Trademark Office*